United States Patent [19]

Kohler et al.

[11] Patent Number: 5,286,534
[45] Date of Patent: Feb. 15, 1994

[54] PROCESS FOR PLASMA DEPOSITION OF A CARBON RICH COATING

[75] Inventors: Gunter A. Kohler, Grant Township, Washington County, Minn.; Richard W. Duerst, New Richmond, Wis.; Daniel P. Stubbs, May Township, Washington County, Minn.

[73] Assignee: Minnesota Mining and Manufacturing Company, St. Paul, Minn.

[21] Appl. No.: 40,837

[22] Filed: Mar. 31, 1993

Related U.S. Application Data

[62] Division of Ser. No. 811,986, Dec. 23, 1991, Pat. No. 5,232,791.

[51] Int. Cl.$^5$ .............................................. B05D 3/06
[52] U.S. Cl. .................................... 427/577; 427/131; 427/249; 427/585
[58] Field of Search ............... 427/561, 570, 577, 562, 427/131, 249, 585

[56] References Cited

U.S. PATENT DOCUMENTS

| | | | |
|---|---|---|---|
| 4,407,712 | 10/1983 | Henshaw et al. | 204/290 |
| 4,645,977 | 2/1987 | Kurokawa et al. | 315/111.21 |
| 4,755,426 | 7/1988 | Kokai et al. | 428/336 |
| 4,756,964 | 7/1988 | Kincaid et al. | 428/408 |
| 4,780,354 | 10/1988 | Nakayama et al. | 428/141 |
| 4,794,047 | 12/1988 | Funamoto | 428/408 |
| 4,804,590 | 2/1989 | Nakamura et al. | 428/408 |
| 4,820,584 | 4/1989 | Morita et al. | 428/336 |
| 4,833,031 | 5/1989 | Kurokawa et al. | 428/336 |
| 4,861,662 | 8/1989 | Kobliska et al. | 428/408 |

FOREIGN PATENT DOCUMENTS 395412 10/1990 European Pat. Off. .

OTHER PUBLICATIONS

Hilden, M. et al., "Sputtered Carbon on Paticulate Media," *IEEE Transactions on Magnetics*, Jan. 1990.
Matsumoto, S., "Deposition of Diamond from Thermal Plasma", 1988 Spring Meeting of the Materials Research Society, Apr. 5–9, 1988.
Singh, B. et al. "Hollow Cathode Plasma Assisted Chemical Vapor Deposition of Diamond", *Appl. Phys Lett*, May 16, 1988.
Bardos, L. and Dusek, V., "High Rate Jet Plasma-Assisted Chemical Vapour Deposition", 6th International Conference on Ion and Plasma Assisted Techniques, May 1987, U.K.

*Primary Examiner*—Bernard Pianalto
*Attorney, Agent, or Firm*—Gary L. Griswold; Walter N. Kirn; Roger R. Tamte

[57] ABSTRACT

The present invention provides a magnetic recording medium that includes a polymeric flexible substrate and a magnetic layer coating thereon, with a binderless carbon rich layer adhered to the magnetic layer.

The present invention also provides a process for the plasma deposition of the carbon rich coating onto a magnetic medium comprising the steps of:
a. providing a magnetic medium in a vacuum chamber;
b. generating carbon rich plasma in the vacuum chamber by injecting a plasma gas suitable to provide a carbon rich coating into an elongated hollow cathode; and providing a sufficient voltage to create and maintain plasma; and maintaining a vacuum in the vacuum chamber sufficient for the plasma; and
c. exposing the magnetic medium to the plasma while the magnetic medium is influenced by a radio frequency bias electrode to accelerate the plasma towards the magnetic medium and deposit the carbon rich coating on the magnetic medium.

14 Claims, 4 Drawing Sheets

PROCESS FOR PLASMA DEPOSITION OF A CARBON RICH COATING

This is a division of application Ser. No. 07/811,986 filed Dec. 23, 1991, U.S. Pat. No. 5232791.

FIELD OF THE INVENTION

This invention relates to magnetic recording media, and particularly, to magnetic recording media having a carbon rich overcoat, and to a method for the plasma deposition of the overcoat.

BACKGROUND OF THE INVENTION

A magnetic recording medium typically consists of a magnetizable material affixed to a substrate. One general type of magnetic medium consists of a magnetizable cured pigment binder coating, derived from a dispersion of magnetizable pigment particles in a polymeric binder, which is coated on a flexible, typically polymeric, non-magnetic support.

Magnetic media are provided in a variety of forms, including audio and video tapes, computer diskettes, and stretched surface recording disks (SSR). SSR generally consist of a rigid, circular support and a thin polymeric film, having a recording layer, suitably attached to the periphery of the support. See, for example, U.S. Pat. No. 4,623,570.

For optimum performance, magnetic media should have exceptionally smooth, durable recording surfaces, with a minimal coefficient of friction. In present recording media the coefficient of friction often changes with changes in ambient humidity. This causes wanted variations in the performance of the media in varied use environments.

Lubricants are often used in magnetic media to aid in minimizing the wear between the media and the recording head. A lubricant is either added to the dispersion of binder and magnetizable particles before coating, or added as an overcoat layer and allowed to soak into the magnetic layer.

A successful magnetic medium will have a sufficient surface conductivity to avoid electrical static charging during use. For example, a non-conductive magnetic layer coated on a non-conductive flexible substrate, such as polyethylene terephthalate (PET) or polyamide, may require some special treatment to attain adequate conductivity. This may be accomplished by adding a conductor, such as carbon black, to the magnetic pigment before coating. As an alternative, a non-magnetic carbon black coating may be coated onto the back side of the flexible substrate, or underneath the magnetic layer on the front side of the medium.

Each of these methods of providing conductivity has deficiencies. Where carbon black is added to the magnetic layer signal loss results, since the carbon black occupies space that could be used for magnetic pigment. A separate carbon black layer requires extra processing steps, and is therefore costly and decreases production yield.

In present magnetic media, water vapor can permeate the magnetic layer and cause degradation of durability. A magnetic layer that is excessively permeable to water vapor and oxygen can also permit fungal growth or oxidation of the magnetic pigment.

Carbon coatings have been applied to rigid disks and non-binder type magnetic media, see, e.g., U.S Pat. No. 4,833,031, but have not been used to successfully address durability, permeability, nor the stability of the coefficient of friction with changes in ambient humidity. Flexible magnetic recording media typically address durability by utilizing surface applied lubricants, and use carbon black to enhance conductivity.

Means for preparing a carbon coating by plasma deposition have existed previously, but have had deficiencies. U.S. Pat. No. 4,645,977 shows a method for forming a carbon film through the use of an induction plasma. The use of high gas flow, pressure, and power can cause formation of carbon powder, instead of the desirable smooth, hard carbon film.

Despite the prior availability of carbon coatings, and the means for plasma deposition of carbon coatings, there remains a need for a flexible magnetic medium having a polymeric layer containing magnetizable pigment, that does not require conductive particles dispersed in the binder layer or in a separate conductive layer. There is also a need for a magnetic medium that is very durable and has a low coefficient of friction that is stable throughout a range of ambient humidities ranging from 0 to 100%. There is also a need for a magnetic recording medium that is substantially impervious to water vapor and oxygen.

SUMMARY OF THE INVENTION

The present invention provides a magnetic recording medium comprising of a substrate with a magnetic layer coating thereon, and a carbon rich layer, that does not include a binder, adhered to the magnetic layer. The substrate is both polymeric and flexible. The carbon rich layer includes at least 50 atom percent carbon, and typically comprises 70-95 atom percent carbon, 0.1-20 atom percent nitrogen, 0.1-15 atom percent oxygen, and 0.1-40 atom percent hydrogen.

The carbon rich layer preferably is substantially impervious to water vapor and oxygen, has a Mohs hardness of about 5-8, and a surface conductivity of about $10^8$-$10^{12}$ ohms/square. The magnetic recording medium with the carbon rich layer will preferably have a substantially stable dynamic coefficient of friction when exposed to ambient humidities ranging from 0 to 100%.

The present invention also provides a process for the plasma deposition of a carbon rich coating onto substrates which include magnetic media comprising the steps of: (a) providing a substrate in a vacuum chamber; (b) generating a carbon rich plasma in the vacuum chamber by: (1) injecting a plasma gas, suitable to provide a carbon rich coating, into an elongated hollow cathode, (2) providing a sufficient voltage to create and maintain a plasma, and (3) maintaining a vacuum in said vacuum chamber sufficient for said plasma; and (c) exposing the substrate to the plasma while the substrate is influenced by a radio frequency bias means, whereby the plasma is accelerated towards the substrate and is deposited thereon as a carbon rich coating. Although the remainder of this description relates to magnetic recording media, the process described can be used to deposit carbon coatings on any substrate which can be coated in a plasma deposition glow discharge process. Normally, substrate thickness is no more than 1 cm.

The plasma gas is any suitable source for the desired composition of the carbon rich coating, such as hydrogen, carbon, nitrogen, and oxygen. The plasma gas may be gaseous or a vaporized liquid, and may also include a carrier gas, such as argon. Use of a nitrogen containing gas may also be desired for some applications.

Typically, the radio frequency bias means is a radio frequency bias electrode that has a frequency of about 100 KHz to 400 KHz and a bias voltage of about 100 to 1500 volts. It is possible to increase the frequency range up to and including the megahertz range. A preferred means to create the voltage is by means of a pulsed DC power supply. The voltage created and maintained in the hollow cathode is typically −200 to −4000 volts. The power supplied to the hollow cathode is typically 200 to 12,000 watts, more typically 500 to 2,000 watts.

The hollow cathode is preferably made of graphite or a refractory metal, such as tungsten, tantalum, or molybdenum, and typically has a length to diameter ratio of about 10:1 to 1:1, and an internal diameter of about 0.5 centimeter to 5 centimeters. Where the hollow cathode has other than a circular cross-section, "diameter" means the greatest cross-sectional dimension. The hollow cathode is preferably water cooled when heat sensitive substrates are coated.

It is preferable that the substrate contacts the radio frequency bias electrode (e.g., a copper plate) during deposition of the plasma. A vacuum will be maintained typically at about 1–300 mTorr, preferably 5–50 mTorr, and the total feed gas flow rate will typically be about 10–500 sccm.

The magnetic medium will preferably be of the pigment binder type described above, with the carbon rich layer coated onto the magnetizable layer.

One or more additional hollow cathodes that generate carbon rich plasmas may also be included. The additional cathode(s) can provide more than one type of coating onto the magnetic medium or can provide an increased rate of deposition of the carbon rich layer.

As used herein, the term "carbon rich" means that the carbon rich layer has at least about 50 atom percent carbon.

As used herein, the term "flexible" as applied to magnetic media, means that a magnetic recording medium with a low bending stiffness, D, compared to the bending stiffness of a magnetic data recording rigid disk (e.g., Winchester or hard disk). D is defined as:

$$D = \frac{Ed^3}{12(1-v)}$$

where
d = recording layer + substrate thickness in meters
E = Young's modulus of recording layer + substrate in Newtons per meter squared
$v$ = Poisson's ratio of recording layer + substrate As used herein, the term "substantially impervious" as applied to the carbon rich layers means that a 200 angstrom thick carbon rich layer is a barrier to water vapor and to oxygen, and allows less than two g/m²-day of water vapor and less than two cm³/m²-day-atm oxygen to be transmitted through the layers. Oxygen permeability was measured using a Mocon Permeability Tester manufactured by Modern Controls, Inc., Minneapolis, Minn., according to ASTM Test Method D-3985. The test chamber was purged with nitrogen to displace background oxygen, and a first oxygen permeability test was performed. Oxygen was then introduced into the test chamber, and a second permeability measurement was performed after the prescribed time. The difference between the first and second measurements was reported as permeability.

As used herein, the term "substantially stable" as applied to the dynamic coefficient of friction of the magnetic recording medium, means that the dynamic coefficient of friction does not vary by more than 20% over the specified range of conditions.

DETAILED DESCRIPTION

The present invention provides a magnetic recording medium having a carbon rich overcoat. The present invention also provides a method for depositing a superior carbon rich overcoat on a magnetic medium by means of jet plasma deposition. Magnetic media of the present invention comprise, in general terms, a polymerized dispersion of magnetizable particles in a binder (magnetic layer), provided as a coating on a flexible, non-magnetic support. The carbon rich overcoat is deposited on, and adheres to, the magnetic layer. The term "flexible" is described above. The difference between a flexible medium and a rigid medium is shown by comparing the D values for a typical rigid disk and three flexible disks: the Bernoulli disk of Iomega Corporation, the common diskette, and a Stretched Surface Recording disk (SSR).

|  | Rigid Disk | Bernoulli | Diskette | SSR |
| --- | --- | --- | --- | --- |
| D (N-m) | 36.4 | $2.00 \times 10^{-4}$ | $2.00 \times 10^{-4}$ | $1.98 \times 10^{-5}$ |

Thus, flexible for purposes of this description means that D is less than 36, preferably less than $1 \times 10^{-2}$.

Jet Plasma Apparatus

Figure 1:
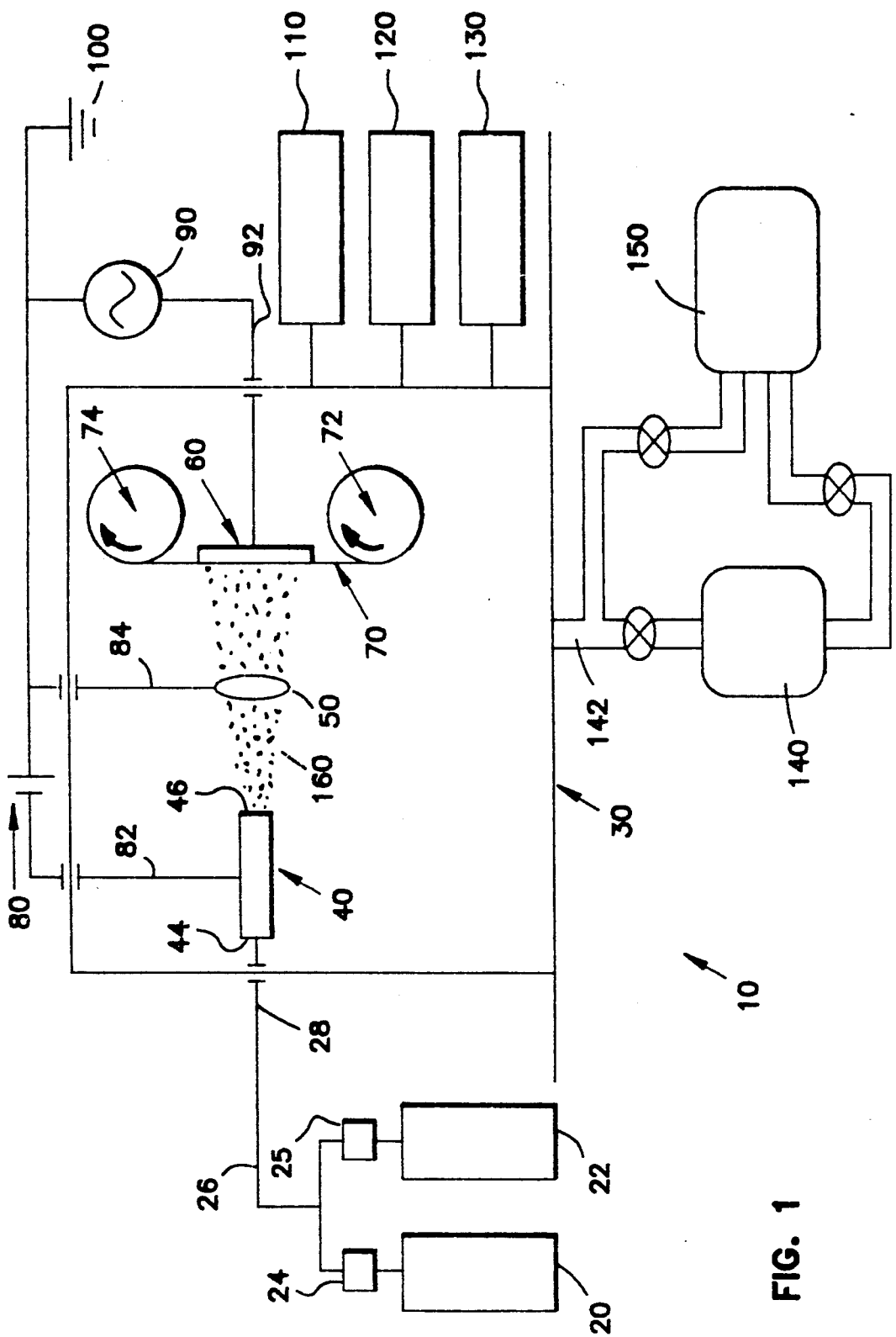
FIG. 1 is a schematic diagram of a jet plasma vapor deposition apparatus of the present invention.

Referring to FIG. 1, the jet plasma apparatus, generally indicated as 10, is shown. The apparatus includes plasma gas sources 20 and 22 connected via flow controllers 24 and 25 to an inlet tube 26. Plasma gas from the flow controllers 24 is fed into a vacuum chamber 30 and into a hollow cathode 40 through an inlet port 28.

Inside the vacuum chamber 30 is the hollow cathode 40, an anode 50, a radio frequency bias electrode 60, and a substrate (e.g., magnetic recording medium) 70. The substrate 70 is unwound from a first roll 72 and is rewound upon a second roll 74.

Plasma gas from the flow controllers 24 and 25 is fed into the vacuum chamber 30 and into the hollow cathode 40. A DC pulsing power supply 80 (e.g., Airco Temescal Model CL-2A 500 mA maximum output power supply) is electrically connected directly to the hollow cathode 40 by a circuit 82 and to the anode 50 by a circuit 84 for supporting a glow discharge. An AC biasing power supply 90 (e.g., Plasmaloc 3 power supply from ENI Power Systems, Inc., Rochester, N.Y.) is connected to the radio frequency bias electrode 60 by a circuit 92. The AC power supply 90, and the DC power supply 80, are both connected to a ground 100.

To monitor the conditions in the vacuum chamber 30, a mass spectrometer 110, an emission spectrometer 120 and a capacitance manometer 130 are provided, and connected to the vacuum chamber 30.

A vacuum is created and maintained within the vacuum chamber 30 by a diffusion pump 140 and a mechanical pump 150, connected to the chamber 30 by means of a vacuum inlet 142.

The hollow cathode 40 is a hollow passageway having any of a variety of cross-sections, e.g., circular, square, rectangular, or octagonal. The cathode 40 has a gas inlet 44 and a plasma outlet 46. The length of the cathode is the distance between the inlet 44 and the outlet 46. The "diameter" of the cathode is defined as the largest cross-sectional dimension of the cathode, regardless of whether the cathode has a cylindrical cross-section, or otherwise.

Gas from the flow controllers 24 and 25 is provided at the inlet 44 through the inlet port 28. Typically, the plasma gas is injected into the hollow cathode 40 at a total feed gas flow rate of about 15-500 sccm.

Typically, the elongated hollow cathode 40 has a length to diameter ratio ranging from about 15:1 to 1:1. The cathode 40 is preferably circular in cross-section, and has an internal diameter of about 0.5 cm to 5 cm. The cathode is preferably a high refractory material such as graphite, molybdenum, tungsten, or tantalum, so as to withstand temperatures in excess of 2000° C. However, operating temperatures of less than 2000° C. are common. Because of the high temperatures, the tube 40 must be held in the vacuum chamber by a fastener which itself is resistant to the heat present.

With the larger diameter tubes, there can be some additional components. For example, a quartz tube, concentric with the cathode, may be used for introducing the plasma gas. It extends from inlet 44 part of the way through the length of the cathode (e.g., half of the cathode length). The location of the quartz tube tip (discharge end) relative to the outlet 46 of the cathode affects the voltage of the deposition process, and can be used to adjust it. At higher powers, involving higher temperatures in the cathode and the quartz tube, the quartz tube might be degraded, and, therefore, there is a shield of graphite in between the quartz tube and the inside of the hollow cathode.

The interior of the tubular cathode is used for fragmentation of a carbon source, such as acetylene, in the plasma feed gas. The plasma feed gas is confined in tube 40 upon entering the apparatus so that it jets from outlet end 46.

The voltage created and maintained in the vacuum chamber 30 is preferably generated by a pulsed DC power supply. A preferred pulsed DC power supply will provide a voltage that passes through zero typically 25-200 times/second. The voltage created and maintained in the hollow cathode is about −200 to −4000 volts. The power supplied to the hollow cathode is typically 200 to 12,000 watts, more typically 500 to 2,000 watts.

Use of a pulsed DC power supply allows relatively high current flow while maintaining a glow discharge, rather than an arc in the vacuum chamber. In experiments leading to the reduction to practice of this invention, it was found that with a normal DC power supply, when current density of the plasma exceeds a certain limit, the discharge becomes an arc. A 25 kilowatt DC power supply from Hipotronics originally provided 0-3000 V filtered direct current from a 480 V, 3 phase line. Stable glow discharge was sustained with that power supply up to about 400 mA at about −500 volts. Increasing plasma current further resulted in an arc discharge with a voltage below 100 V. The power supply was modified to operate from a 480 V, single phase line with the output filter capacitors removed. The modification provided a pulsed (120 Hz) DC potential of 0-3000 V at about 3 Amps.

Given the correct conditions, a stable jet plasma 160 (glow discharge) is formed in the vacuum-chamber extending in a generally conical pattern from the plasma outlet 46 of the cathode 40. Preferred plasmas will have a high fragmentation rate of the feed gases so as to provide a rapid deposition rate of the carbon rich coating on the substrate 70.

The radio frequency bias electrode 60 is typically a metal plate, such as copper. A water cooled metal plate is a preferred bias means. The radio frequency bias electrode typically has a frequency of about 100 KHz to 400 KHz and a bias voltage of about minus 100 volts to minus 1500 volts. It is preferred that the substrate 70 contacts the radio frequency bias electrode 60 during deposition of the plasma. With the bias voltage an additional plasma is created in the proximity of the radio frequency bias electrode 60 that applies a negative potential to the substrate, and draws the plasma 160 towards the substrate 70 for efficient and rapid deposition.

Carbon Rich Overcoat

The present invention provides a carbon rich overcoat that improves durability, increases conductivity, and provides a substantially impervious barrier to water vapor and oxygen. A carbon rich layer of the invention typically includes a composition with greater than 50 atom % amorphous carbon, along with other components such as oxygen, nitrogen, and hydrogen. The carbon rich overcoat is wear resistant and tough, and adheres well to the magnetic media even at high humidity. The carbon rich overcoat can be stretched two-dimensionally without significantly decreasing the performance of the carbon rich coating, and is therefore readily usable in an SSR format.

The composition of the carbon rich coating can be controlled by means of: 1) the pressure of the plasma gas, 2) the composition of the feed gas, 3) the configuration of the hollow cathode, and 4) the electric power applied both from the pulsed DC and radio frequency power supplies. The feed gas will include a carbon source, for example, of: saturated and unsaturated hydrocarbons such as methane, ethane, ethylene, acetylene, or butadiene; nitrogen containing hydrocarbons such as methylamine, or methylcyanide; oxygen containing hydrocarbons, such as methylalcohol, or acetone; or halogen containing hydrocarbons, such as methyliodide, or methylbromide; and silicon containing hydrocarbons, such as tetramethylsilane, chlorotrimethyl silane, or tetramethoxysilane. The unsaturated hydrocarbons, nitrogen containing, and halogen containing hydrocarbons are preferred.

The carbon source may be gaseous at the temperature and pressure of use, or may be an easily volatilized or vaporized liquid carbon source. A carrier gas may also be used in conjunction with the hydrocarbon source gas. The carrier gas may be inert, such as helium, neon, argon, or krypton. Nitrogen has been found to provide desirable characteristics to the carbon rich coating, such as increasing the conductivity of the carbon rich overcoat.

The thickness of the coating will typically be greater than 5 nanometers, preferably about 10 to 100 nanometers, more preferably 10–40 nm and even more preferably 10–20 nm. Thicker coatings are possible, but not typically needed. The substrate moves through the plasma at a rate designed to provide a coating of a desired thickness. The speed at which substrate 70 travels from roll 72 to roll 74 is typically 4 to 400 mm/second for the gas flow rates and the apparatus described above.

Binders

Media of the present invention utilize any suitable polymeric binder which adheres a magnetizable pigment dispersion to the substrate 70. Examples of suitable binders include polyvinyl chloride, polyvinyl acetate, polyacrylates, polyester, polyester amides, a thermoplastic polyurethane resin, cellulose derivatives, such as cellulose-acetate butyrate, styrene-butadiene copolymers, a phenoxy resin, a copolymer of butadiene and methacrylic acid, copolymers of at least two monomers selected from the group consisting of vinyl chloride, vinyl acetate, acrylonitrile, vinyl alcohol, vinyl butyryl and vinylidene chloride. For example, VAGH commercially available from Union Carbide, and other various thermosetting, thermoplastic, or radiation curable resins are acceptable.

Lubricants

The carbon rich overcoat will act to increase durability and reduce the coefficient of friction, and can therefore replace conventional lubricants. However, it has been found that certain lubricants can be bound to the surface of a carbon rich overcoat and provide additional benefits.

As disclosed in U.S. Pat. No. 3,490,946, fluorocarbon compounds can be used as lubricants for magnetic recording media. U.S. Pat. Nos. 3,778,308; 4,267,238; and 4,268,556 disclose the use of perfluoropolyethers (PPE) as lubricant protective layers for magnetic media. Lubricants having a suitable pendant or terminal functional group can be chemically bound or crosslinked on the carbon rich overcoat. For example, lubricants comprising acrylated perfluoropolyethers may be cross-linked. See, for example, U.S. Pat. No. 4,526,833. The addition of, for example, a polyperfluoroether lubricant overcoat (typically 0.5 mg. per side of a 3.5 inch (89 mm) diameter recording disk) has been found to further improve the durability of the carbon rich overcoat.

The perfluoropolyethers of U.S. Pat. No. 4,526,833 can be cross-linked by radiation; such as ultraviolet (uv) radiation (see U.S. Pat. No. 4,526,833 Column 9, lines 46–56). Small amounts (e.g., 4.5 parts by weight based on 100 parts by weight PPE) of initiator can be used in admixture with the PPE. One such initiator is a modification of Darocure 2959 initiator (from EM Industries, Inc., Hawthorne, N.Y.). The Darocure initiator can be modified by reacting it with perfluorobutoxydiisopropoxy-2-propionyl fluoride, the synthesis of which is taught in U.S. Pat. No. 4,749,526, Example 10.

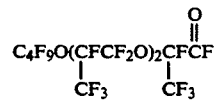

The formula of the modified Darocure initiator is believed to be:

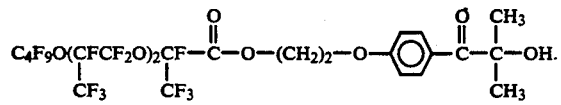

In one experiment to make the modified Darocure initiator, 295 g of the perfluorobutoxydiisopropxy-2-propionyl fluoride was reacted with 66.55 g of Darocure 2959. The Darocure 2959 initiator and 300 ml of tetrahydrofuran were mixed in a i liter, 3-neck flask equipped with a mechanical stirrer, a condenser and nitrogen bubbler. The perfluorobutoxydiisopropoxy-2-propionyl fluoride was added over a 10 minute period. The resulting tan colored mixture was refluxed overnight. A dark amber product was obtained.

Other Components

Materials for the non-magnetic support on which the magnetic coating composition is coated include polyesters, such as polyethylene terephthalate or polyethylene-2,6-naphthalate; polyolefins such as polyethylene or polypropylene; cellulose derivatives such as cellulose triacetate; materials such as polyphenylene sulfides, polycarbonate, polyimide or polyimide. Preferred examples of the supports include polyethylene terephthalate; polyethylene-2,6-naphthalate and polyimide films.

The thickness of these supports is generally about 5 to 100 micrometers, but can vary widely over the above range depending upon the utility of magnetic recording media. The support is flexible so that the magnetic medium with support, magnetizable layer, and carbon rich overcoat, is flexible.

The magnetic media of the present invention may be provided in any desired configuration such as audio tape, video tape, computer diskettes, or SSR. The present invention is particularly useful in SSR (see, for example, U.S. Pat. No. 4,623,570 which is incorporated herein by reference). SSR are held in a stretched configuration with a radial tension.

The invention is further described by the following non-limiting examples:

EXAMPLES 1-6

Carbon rich coatings of the present invention were made with varying ratios and types of feed gases to vary the elemental composition of the resultant coating. A graphite tube was used as the hollow cathode 40 which was 10 cm long, 1.2 cm inside diameter and placed at a distance of 10 cm away from the substrate 70. The bias voltage was kept constant at −1275 V.

Table I shows typical elemental composition of carbon rich coatings and typical processing conditions of the present invention. Chemical modification of the coatings was obtained by changing the feed gas components, and by changing the ratio of the feed gas components (within one system). Since the data of Example 1-4 have been obtained by ESCA (Electron Spectroscopy for Chemical Analysis) they do not include hydrogen which, according to FTIR (Fourier. Transform Infrared) spectroscopy, is also present in the coatings. Data of Examples 5 and 6 have been obtained by microcombustion analysis.

TABLE I

| Ex. | Feed Gas | sccm | Pressure [mTORR] | DC Power [mA/V] | Time A [Sec] | C at % | O at % | N at % | H at % |
|---|---|---|---|---|---|---|---|---|---|
| 1 | $C_2H_2$/Ar | 80/150 | 7 | 475/500 | 19 | 94.0 | 6.0 | | |
| 2 | $C_2H_2$/Ar | 20/150 | 5 | 475/450 | 50 | 93.1 | 6.9 | | |
| 3 | $C_2H_2$/$N_2$ | 80/140 | 6 | 475/600 | 19 | 83.9 | 7.1 | 9.0 | |
| 4 | $C_2H_2$/$N_2$ | 20/140 | 4 | 475/1100 | 50 | 75.4 | 10.8 | 13.9 | |
| 5 | $C_2H_2$/Ar | 40/150 | 12 | 475/660 | 3600 | 71.5 | 3.7 | 1.0 | 23.8 |
| 6 | $C_2H_2$/$N_2$/Ar | 40/50/100 | 12 | 475/650 | 3600 | 69.0 | 3.0 | 7.0 | 21.0 |

A = exposure time
C = carbon
O = oxygen
N = nitrogen
H = hydrogen
at = atom
v = negative volts

COMPARATIVE EXAMPLE A

SSR disks without carbon coating were exposed to varying levels of relative humidity while the coefficient of friction of these disks was being measured. This was done to test the effect of relative humidity on the coefficient of friction of the disks. The SSR disks were prepared according to U.S. Pat. No. 4,623,570. The magnetic medium used to prepare the SSR disks consisted of a magnetic layer coated onto 37.5 μm PET. The magnetic layer contained Co-doped gamma iron oxide and aluminum oxide particles in a polymeric binder. The polymeric binder comprised polyurethane (Estane 5703), vinyl (VAGH) from Union Carbide, and isocyanate.

Figure 2:
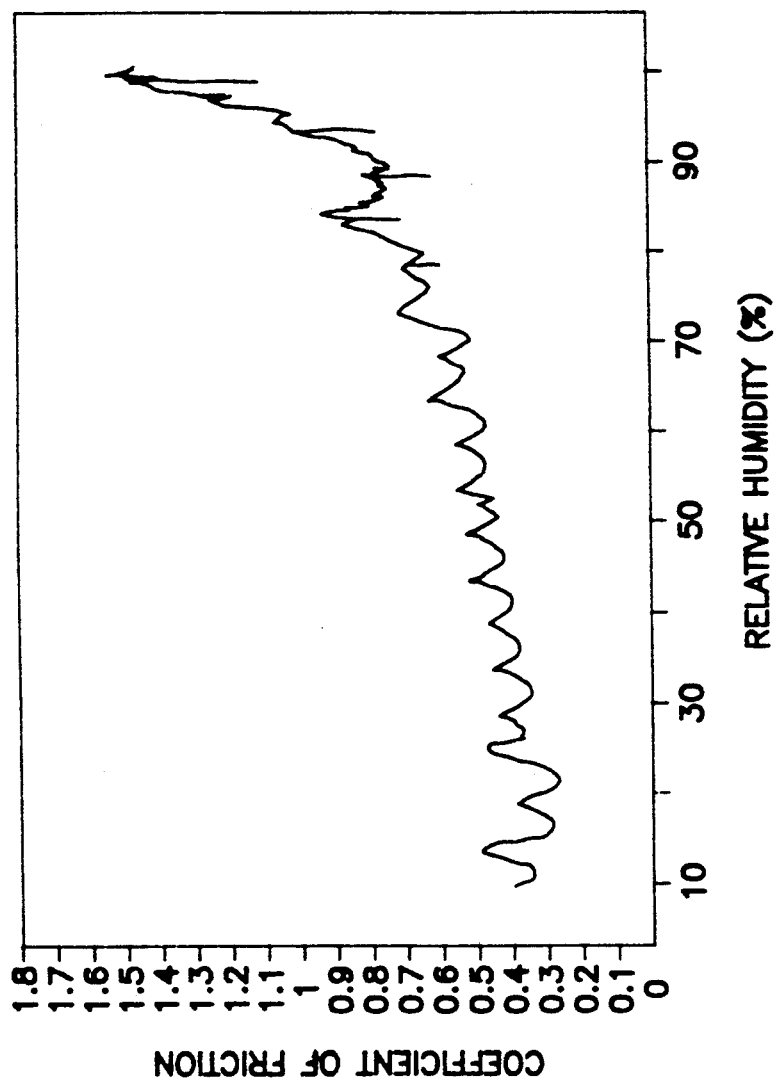
FIG. 2 is a plot of coefficient of friction (Y-axis) versus relative humidity (%) (X-axis) for a magnetic medium of a comparative example.

FIG. 2 shows a plot of coefficient of friction versus the relative humidity (%) for a non-carbon treated SSR disk. The humidity was varied from below 10% to 90% during the test, and the coefficient of friction increased dramatically with high humidity.

The friction test consisted of placing a glass sphere (9.5 mm diameter) in contact with the SSR disk surface with a nominal 10 gram-force normal loading. The disk was rotated at a very slow speed (from 0.1 to 0.3 rpm) while the normal and tangential forces on the glass sphere were monitored via force transducers. The force transducer signals were digitized and recorded with a personal computer. The coefficient of friction (tangential force divided by the normal force) was calculated and stored by the computer. The test was performed in a sealed chamber which had dry nitrogen gas and moist nitrogen gas flowing through it. The moist nitrogen gas was obtained by bubbling dry nitrogen gas through heated water. By controlling the relative amounts of moist and dry nitrogen supplied to the chamber the relative humidity (RH) could be controlled.

The relative humidity was monitored via a commercial humidity gauge. The results shown in FIG. 2 started at 10% RH for two disk revolutions. The relative humidity was then increased by 10% after each additional two revolutions up to 90% RH. The non-carbon treated SSR disk in FIG. 2 showed a significant increase in coefficient of friction with rising relative humidity.

EXAMPLE 7

Figure 3:
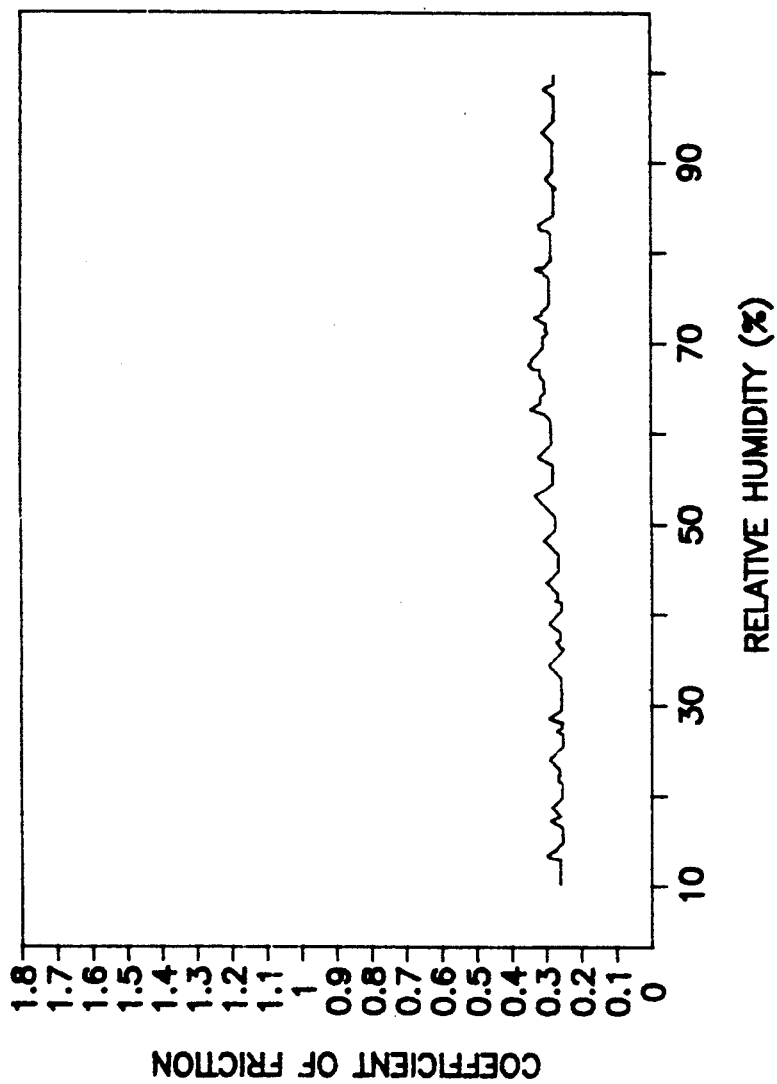
FIG. 3 is a plot of coefficient of friction (Y-axis) versus relative humidity (%) (X-axis) for a magnetic medium of the present invention.

Magnetic media of the present invention were prepared by jet plasma coating the SSR disks of Comparative Example A. The SSR disks were placed on the water cooled copper bias plate 60 and exposed for 22 seconds to the jet plasma. The feed gas was a mixture of 63 sccm 1-chloropropane and 150 sccm argon. A pulsed DC power supply (60 HZ) was set at 450 mA resulting in a voltage of about −500 V to the cathode 40. The bias voltage to bias electrode 60 was about minus 1150 V with a radio frequency of 100 KHz. The pressure in the vacuum chamber was kept around 10 mTorr. A 20 nanometer thick carbon rich coating was deposited on the disk. As shown in FIG. 3, the jet plasma carbon treated magnetic media showed a stable coefficient of friction throughout the range of relative humidity, when tested with the apparatus and methodology described in Comparative Example A.

EXAMPLE 8

The durability of jet plasma carbon coated and uncoated SSR disks was tested by two methods. The SSR disks were prepared with the method of U.S. Pat. No. 4,623,570 using a magnetically coated PET roll. In the first test method, a glass sphere (9.5 mm diameter) was pressed into the disk surface with a 10 gram-force loading and the sample was rotated at a rate of 600 rpm. The sphere was introduced onto the disk surface at a disk radius varying from 2.8 to 3.6 cm from the center of rotation of the disk. The coefficient of friction was monitored, and an increase of more than 20% above its initial value was considered a failure, and the test was terminated with the time-to-failure recorded. In order to fully equilibrate the SSR disks, they were stored at 60% RH for several days prior to testing. The testing was carried out at 5% RH at ambient temperature.

Under these conditions, non-carbon coated disks lasted for approximately one minute. A second set of SSR disks was coated with a solvent-applied primer and a fluorocarbon lubricant. Fluorocarbon lubricant (designated F08) is polyperfluoroether diacrylate. For these disks a primer coating of hydantoinhexacrylate (HHA) was used. Both primer and lubricant were spin coated separately in a solvent solution. Disks from the second set lasted approximately 10 minutes before failing.

A third set of disk samples coated with only the fluorocarbon (F08) also lasted approximately 10 minutes before failing.

A fourth set of samples, coated with a jet-plasma carbon rich coating of 20 nanometers thickness and also with the fluorocarbon lubricant F08, lasted more than eight hours without failure. The jet plasma coating conditions were: Feed gas: 40 sccm $C_2H_2$ and 150 sccm argon; Pulsed (60 HZ) DC power: 475 mA, −500 V; bias voltage; minus 1275 V. pressure: 10 mTorr; web speed: 24 cm/minute. The surface resistivity of the carbon rich coating was about $6 \times 10^{10}$ ohms/square.

In the second method, several SSR disks with a jet plasma deposited carbon rich coating, as described above, were placed into Miniscribe model 8438 hard disk drives that had an SSR head (see e.g., U.S. Pat. No. 4,809,104) to replace the original hard disk recording heads. The drives were placed into an environmentally controlled chamber and the motors were turned on. The environmental conditions were cycled once per day through the set of environmental conditions listed below:

| Condition # | 1 | 2 | 3 | 4 | 5 | 6 |
|---|---|---|---|---|---|---|
| Temperature (°C.) | 21 | 49 | 4 | 21 | 49 | 4 |
| RH (%) | 30 | 20 | 30 | 80 | 80 | 80 |

The SSR disks were monitored for durability failure by one of two methods. In method #1, the disks were monitored visually once per day. Disks with damaged areas beneath the SSR head were considered to have failed. Uncoated disk samples failed within one day (one complete cycle of the environmental conditions). Samples coated with the HHA primer and the fluorocarbon lubricant F08 discussed above, showed variable lifetimes, with the first failure out of five disk samples occurring at one day. Six samples coated with a jet plasma deposited carbon rich protective layer 20 nanometers thick lasted 13 days without such failure. In method #2, a single track of the SSR disk was magnetically recorded with a constant frequency square wave recording current via the SSR head. The drive and disk were then placed into the environmentally controlled chamber and the disk drive motor turned on. The recorded signal was then monitored electronically and if the signal dropped below 20% of a typical signal level for more than 8 microseconds, the drive motor was turned off and the time of failure was logged on personal computer. With this method SSR disks with a jet plasma carbon rich coating and a fluorocarbon lubricant overcoat lasted 80 days without failure.

EXAMPLE 9

Figure 4:
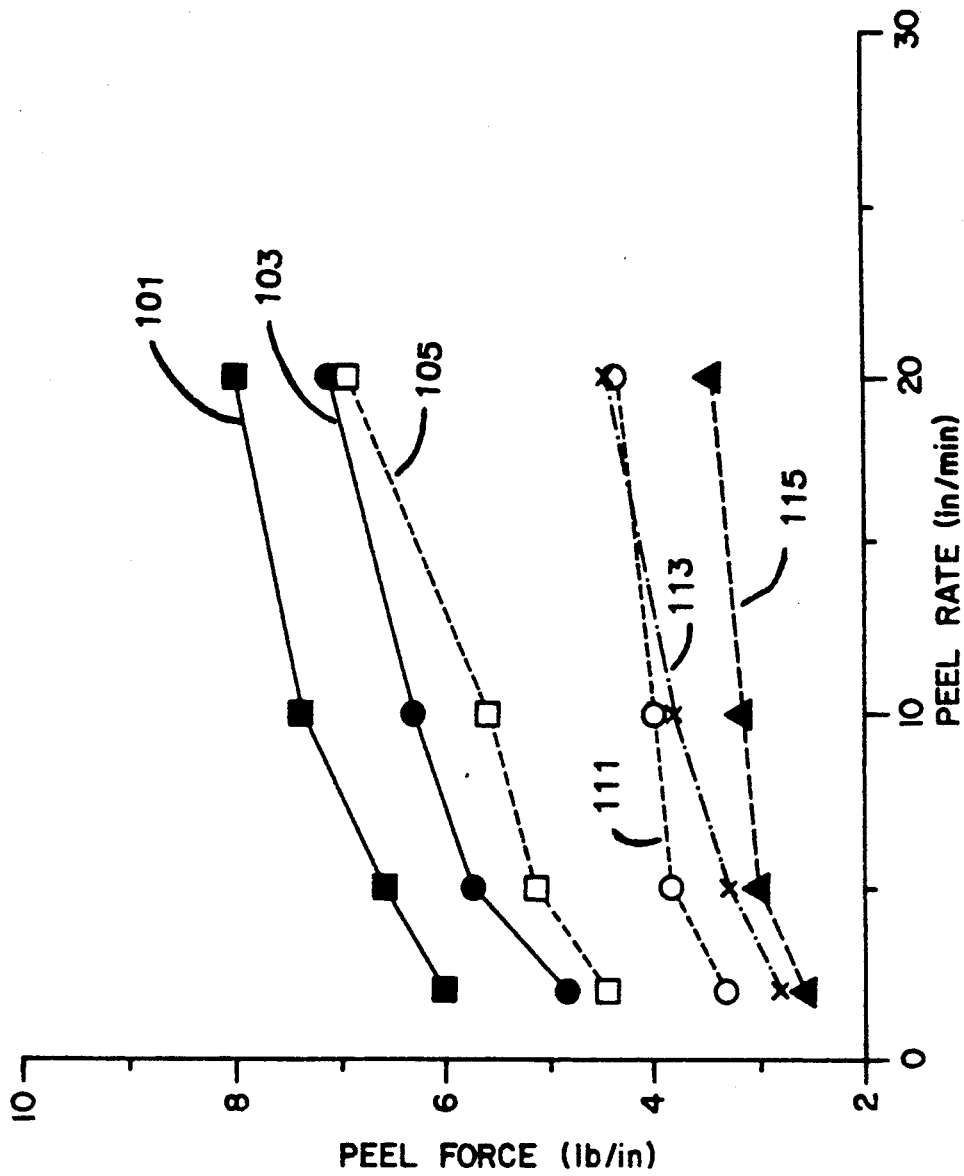
FIG. 4 is a plot of peel force (lb/in) (Y-axis) versus peel rate (in/min) (X-axis) for magnetic media.

A magnetic medium web was overcoated with a jet plasma coating under various conditions summarized in Table II. The hollow cathode was 1.2 cm in inside diameter and 20 cm in front of the magnetic medium. Exposure time was 50 seconds; bias voltage was minus 1275 V; pulse frequency was 60 HZ; and web speed was 24 cm per minute. The samples were tested for 180 degrees peel and the results are summarized in FIG. 4.

TABLE II

| Number[A] | Feed Gases | DC-Voltage | Amperage | Pressure |
|---|---|---|---|---|
| 101 | 80 sccm $C_2H_2$<br>150 sccm Ar | −500 V | 475 mA | 10 mTorr |
| 103 | 80 sccm $C_2H_2$<br>140 sccm $N_2$ | −700 V | 475 mA | 10 mTorr |
| 111 | 40 sccm $C_2H_2$<br>150 sccm Ar | −500 V | 475 mA | 5 mTorr |
| 115 | 40 sccm $C_2H_2$<br>140 sccm $N_2$ | −875 V | 475 mA | 5 mTorr |

[A]FIG. 4

Strong adhesion of the jet plasma coatings to the magnetic media is considered to be a prerequisite for a durable, tough overcoat. The back of the magnetic media samples were affixed to a rigid aluminum strip using epoxy resin. 25 μm thick polyimide (kaptron polyimide from DuPont) strips were affixed to the jet plasma coated side of the magnetic media using aggressive pressure sensitive adhesive. To improve bonding, the test samples were heat-treated for 24 hours at 60° C. and allowed to cool to room temperature. The polyimide strips were removed from the coating at several speeds in a 180 degree peel using an Instron instrument, Model 1122. The forces required for separation were graphed in FIG. 4. Plots 105 and 113 were the test results of control samples without jet plasma coatings. Plots 101, 103 and 105 were the test results of samples stored for about 24 hours at ambient conditions and plots 111, 113 and 115 were the test results of samples stored for about 24 hours at 60° C. and 100% relative humidity. All failures occur at the adhesive/carbon-rich coating interface and not at the carbon-rich coating/magnetic media interface. Thus, the adhesion of the overcoats are even stronger than the peel strength values indicate.

EXAMPLE 10

Coatings of the present invention were coated on silicon chips and the Mohs hardness of the coating was measured. At a high bias voltage of around minus 1000 V, the Mohs hardness values of the coatings of the invention are about 6-8; at lower voltages (around minus 500 V), the Mohs hardness was about 5-6; with no bias voltage, the Mohs hardness was below five.

EXAMPLE 11

Uncoated magnetic media samples (as described in comparative Example A) without a conductive underlayer were tested and found to have surface resistivities in the range of $10^{11}$ to $10^{12}$ ohms/square. Magnetic media of the present invention with jet plasma coatings prepared under conditions of Example 9 (Table II, Plots 103 and 111) had surface resistivities of near or below $10^9$ ohms/square. Thus, coatings of the present invention have good antistatic properties, without sacrificing other desirable properties such as hardness, adhesion, and impermeability to water vapor, oxygen and other gases.

What is claimed is:

1. A process for the plasma deposition of a carbon rich coating onto a substrate comprising the steps of:
   A. providing a substrate in a vacuum chamber;
   B. generating a carbon rich plasma in the vacuum chamber by: 1) injecting a plasma gas, suitable to provide a carbon rich coating, into an elongated hollow cathode; 2) providing a sufficient voltage to create and maintain a carbon rich plasma in the hollow cathode; 3) maintaining a vacuum in said vacuum chamber sufficient for said plasma;
   C. exposing said substrate to said plasma while said substrate is in close proximity to a radio frequency bias means, whereby said plasma is accelerated towards said substrate and is deposited thereon as a carbon rich coating.

2. The process of claim 1 wherein the substrate is a magnetic recording medium.

3. The process of claim 2 wherein the magnetic medium contacts said radio frequency bias means during deposition of the plasma and said radio frequency bias means is an electrically conductive plate.

4. The process of claim 2 wherein said magnetic medium comprises a flexible non-magnetic substrate, and a polymeric binder containing a magnetizable pigment, wherein said carbon rich layer is coated onto said polymeric binder containing a magnetizable pigment.

5. The process of claim 1 wherein the voltage created and maintained in said vacuum chamber is generated by a pulsed DC-power supply.

6. The process of claim 1 wherein the voltage created and maintained in the hollow cathode is −200 to −4,000 volts and the current is 250 to 3,000 mA.

7. The process of claim 1 wherein the hollow cathode comprises a refractory material selected from the group consisting of graphite, molybdenum, tungsten, and tantalum.

8. The process of claim 1 wherein the elongated hollow cathode has a length of diameter ratio of 15:1 to 1:1.

9. The process of claim 1 wherein said plasma gas includes a gas selected from the group consisting of saturated and unsaturated hydrocarbons, nitrogen containing hydrocarbons, oxygen containing hydrocarbons, halogen containing hydrocarbons, and silicon containing hydrocarbons.

10. The process of claim 1 wherein the vacuum in the vacuum chamber is maintained at about 1 to 300 mTorr.

11. The process of claim 1 wherein the plasma gas is injected into the hollow cathode at a total feed gas flow rate of about 10 to 500 sccm.

12. The process of claim 1 wherein the radio frequency bias means has a frequency of 100 KHz to 400 KHz and a bias voltage of 100 volts to 1500 volts.

13. The process of claim 1 further including one or more additional hollow cathodes that generates one or more additional plasmas.

14. The process of claim 13, wherein more than one type of coating is deposited onto said magnetic medium.

* * * * *